United States Patent
Barber et al.

(10) Patent No.: US 8,143,105 B2
(45) Date of Patent: Mar. 27, 2012

(54) SEMICONDUCTOR SEAL RING AND METHOD OF MANUFACTURE THEREOF

(75) Inventors: Bradley Barber, Acton, MA (US); Tony LoBianco, Irvine, CA (US); David T. Young, Irvine, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 275 days.

(21) Appl. No.: 12/466,064

(22) Filed: May 14, 2009

(65) Prior Publication Data

US 2009/0221129 A1    Sep. 3, 2009

Related U.S. Application Data

(62) Division of application No. 11/442,096, filed on May 25, 2006, now Pat. No. 7,557,430.

(51) Int. Cl.
*H01L 21/44* (2006.01)
*H01L 21/48* (2006.01)
*H01L 21/50* (2006.01)

(52) U.S. Cl. ........................ 438/113; 438/114

(58) Field of Classification Search .......... 438/106–127, 438/460, E23.085
See application file for complete search history.

(56) References Cited

U.S. PATENT DOCUMENTS

| | | |
|---|---|---|
| 3,600,218 A | 8/1971 | Pennebaker |
| 5,882,986 A | 3/1999 | Eng et al. |
| 5,899,729 A | 5/1999 | Lee |
| 6,424,238 B1 | 7/2002 | Penunuri |
| 6,781,244 B2 * | 8/2004 | Prabhu .................. 438/108 |
| 7,060,526 B2 | 6/2006 | Farnworth et al. |
| 7,338,827 B2 | 3/2008 | Sugahara et al. |
| 7,625,779 B2 | 12/2009 | Takahashi |
| 2004/0188819 A1 | 9/2004 | Farnworth |
| 2006/0166478 A1 | 7/2006 | Sugahara et al. |

* cited by examiner

*Primary Examiner* — Cuong Q Nguyen

(57) ABSTRACT

An improved semiconductor seal ring and method therefore is described. The seal ring comprises a thick layer wherein at least a portion of the thick layer is removed from a singulation street prior to singulation, thereby avoiding damage to the thick layer during the singulation process. A thin moisture-proof barrier layer is preferably deposited over at least a portion of the thick layer to seal at least an edge of the thick layer. A thick nonmetallic layer preferably used for fabrication of active circuit elements may advantageously be employed as the thick layer (for example, an aluminum nitride (AlN) layer in, for example, a bulk acoustic wave (BAW) filter device). A thin amorphous nonmetallic layer (e.g., a silicon nitride (SiN) layer) may preferably be deposited over the thick layer. Alternatively, other materials may be used.

6 Claims, 5 Drawing Sheets

SEMICONDUCTOR SEAL RING AND METHOD OF MANUFACTURE THEREOF

CROSS REFERENCE TO RELATED APPLICATIONS

This application is a divisional of, and claims the benefit under 35 U.S.C. §§120 and 121 of, U.S. patent application Ser. No. 11/442,096 entitled "SEMICONDUCTOR SEAL RING," filed on May 25, 2006 now U.S. Pat. No. 7,557,430, which is herein incorporated by reference in its entirety.

BACKGROUND OF THE INVENTION

1. Field of the Invention

The invention relates generally to semiconductor device manufacturing and more particularly to processes and methods for protecting semiconductor dice during and after singulation.

2. Background Art

Semiconductor devices are often designed with a protective seal ring around the device perimeter. Such a seal ring provides an alignment feature for saw singulation of the device from the semiconductor wafer, provides a barrier to chipping and/or cracking during the saw singulation process, and acts as a barrier to moisture penetration to maintain long term reliability. The seal ring is typically formed from stacked metal layers such as aluminum, internal to the device, applied during semiconductor processing. In certain semiconductor process flows, such as bulk acoustic wave (BAW) filter flows, these metal layers are unavailable, not definable, or undesirable, rendering traditional seal ring technology infeasible. Thus, an improved semiconductor seal ring that does not rely on stacked metal layers is needed.

SUMMARY OF THE INVENTION

An improved semiconductor seal ring and method therefor is described. The seal ring comprises a thick layer wherein at least a portion of the thick layer is removed from a singulation street prior to singulation, thereby avoiding damage to the thick layer during the singulation process. A thin moisture-proof barrier layer is preferably deposited over at least a portion of the thick layer to seal at least an edge of the thick layer. A thick nonmetallic layer preferably used for fabrication of active circuit elements may advantageously be employed as the thick layer (for example, an aluminum nitride (AlN) layer in, for example, a bulk acoustic wave (BAW) filter device). A thin amorphous nonmetallic layer (e.g., a silicon nitride (SiN) layer) may preferably be deposited over the thick layer. Alternatively, other materials may be used.

DETAILED DESCRIPTION OF THE INVENTION

Figure 1:
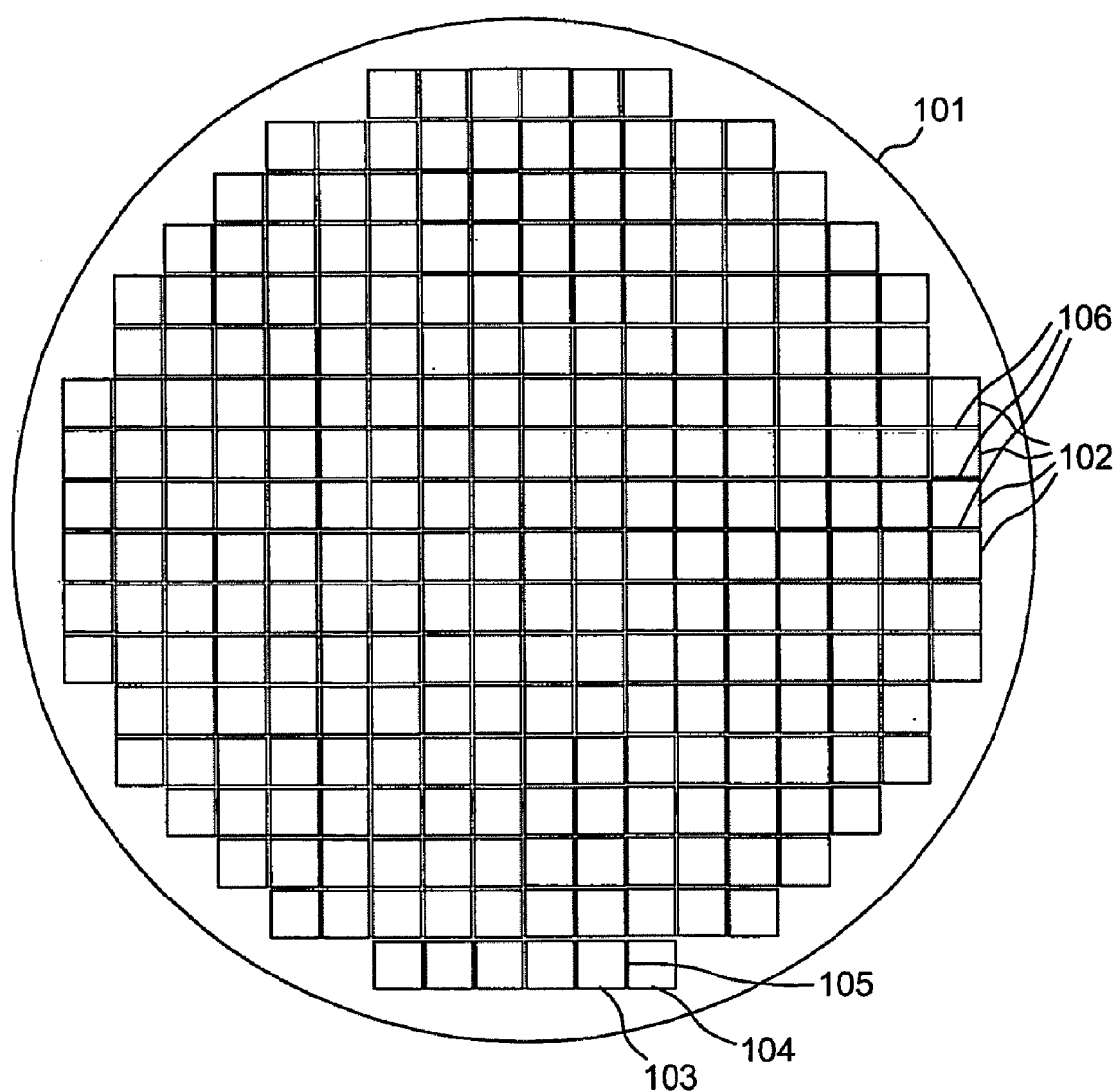
FIG. 1 is a plan view diagram of a semiconductor wafer 101 in accordance with at least one embodiment.

The present invention is directed to an improved semiconductor seal ring and method therefor. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings. It should be noted that similar numerals generally refer to similar elements in the various drawings.

The method for seal ring creation involves selective removal of layers to achieve the sawing alignment, chipping reduction, and moisture barrier objectives. An improved seal ring that provides effective chipping reduction without reliance on stacked metal layers is useful, for example, in BAW filter devices where one typically finds a highly oriented AlN piezoelectric film used in the process of fabricating active circuit elements of the devices. A preferred solution involves consideration of two layers. The first layer, AlN, is used in the core function of the device and thus already exists on the wafer. In a BAW filter process this AlN layer can be quite thick (e.g., 1-2 μm), can be oriented in a packed grain structure subject to brittle fracture, and may have considerable film stress. Each of these properties can make sawing this layer challenging, as they can cause significant chipping at the saw. Thus it is vital and novel to remove the AlN from the saw street to achieve a reduced amount of die chipping during the sawing operation. Additionally beneficial is to use an etch process to remove the AlN from the street that leaves a tapered profile on the AlN edge such that subsequent passivation films, which may be selected to provide an effective long-term moisture barrier, smoothly cover and seal this boundary. For instance, a second layer of SiN can be used to cover the entire device to act as a moisture barrier by covering the AlN. SiN is a good choice since it is a dense film good for conformally covering topology and is known to be a good moisture barrier. It is found to not be necessary to pattern the SiN in the street since dicing through this thinner amorphous film will not cause significant chipping. The removal of the AlN also beneficially creates a strong visible contrast, defining the device edge for saw singulation.

In accordance with at least one embodiment, one or more layers deposited over a semiconductor substrate are selectively removed in the areas of a semiconductor wafer to be used as saw streets. Preferably, layers already required for circuit formation are selectively removed. Preferably, such layers are of substantial thickness. Preferably, a tapered profile is defined at the edge of the remaining material. As needed one can use additional passivation layers should the removed material not provide a good moisture barrier. Selective termination of the passivation material provides a space savings advantage over metal seal rings which have an inherent width and spacing to internal circuitry, thus requiring two dimensional growth of the device to accommodate, as metal seal rings require increased area on a wafer. Thus, even if additional metal layers are available in an integrated circuit process, benefit could be obtained by using an improved seal ring as described herein instead of or in addition to a traditional stacked metal seal ring. In accordance with at least one embodiment, a thin layer (e.g., a SiN layer), by itself may be too thin to constrain chipping of the silicon wafer. However, a thick layer (e.g., an AlN layer) may be thick enough to constrain chipping of the silicon wafer (provided it is removed from the street so as not to be chipped itself), thereby serving at least a portion of the functions of a tradition metal seal ring. Yet, a thick layer (e.g., an AlN layer), by itself, may not provide an adequate moisture-proof barrier to maintain long-term reliability. However, a thin layer (e.g., a SiN layer) encapsulating the thick layer or a portion thereof may provide a sealant function by acting as a moisture-proof barrier. Accordingly, the thick layer and the thin layer, as fabricated in accordance with at least one embodiment, may provide attributes beneficial to a seal ring and may replace a traditional metal seal ring.

FIG. 1 is a plan view diagram of a semiconductor wafer 101 in accordance with at least one embodiment. Semiconductor wafer 101 comprises a plurality of dice 102 separated from one another by a plurality of singulation streets 106. Exemplary die 103 is separated from exemplary die 104 by singulation street 105.

Figure 2:
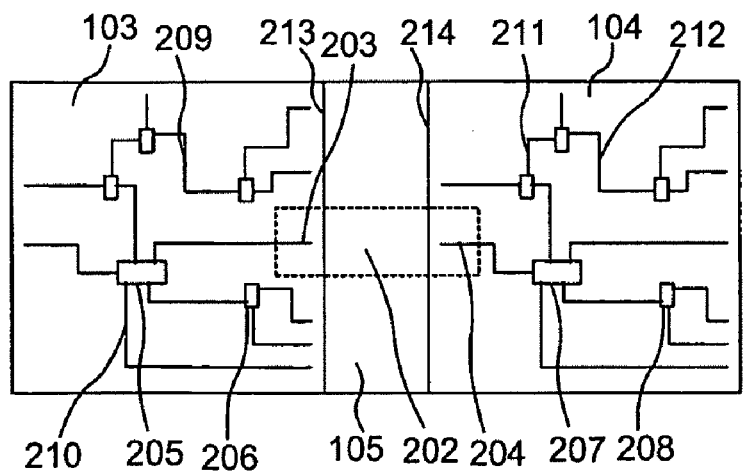
FIG. 2 is a plan view diagram of a portion of semiconductor wafer 101 in accordance with at least one embodiment.

FIG. 2 is a plan view diagram of a portion of semiconductor wafer 101 in accordance with at least one embodiment. A portion of semiconductor wafer 101 comprises dies 103 and 104 and singulation street 105 defined between dies 103 and 104. Die 103 comprises active circuit elements such as exemplary active circuit elements 205 and 206 and conductive interconnects (e.g., vias) such as exemplary conductive interconnects 203, 209, and 210 Die 104 comprises active circuit elements such as exemplary active circuit elements 207 and 208 and conductive interconnects (e.g., vias) such as exemplary conductive interconnects 204, 211, and 212. An edge 213 defines a boundary between die 103 and singulation street 105. An edge 214 defines a boundary between die 104 and singulation street 105. Portion 202 denotes a portion of the portion of semiconductor 101 illustrated in FIG. 2, as will be referenced in relation to other Figures.

Figure 3:
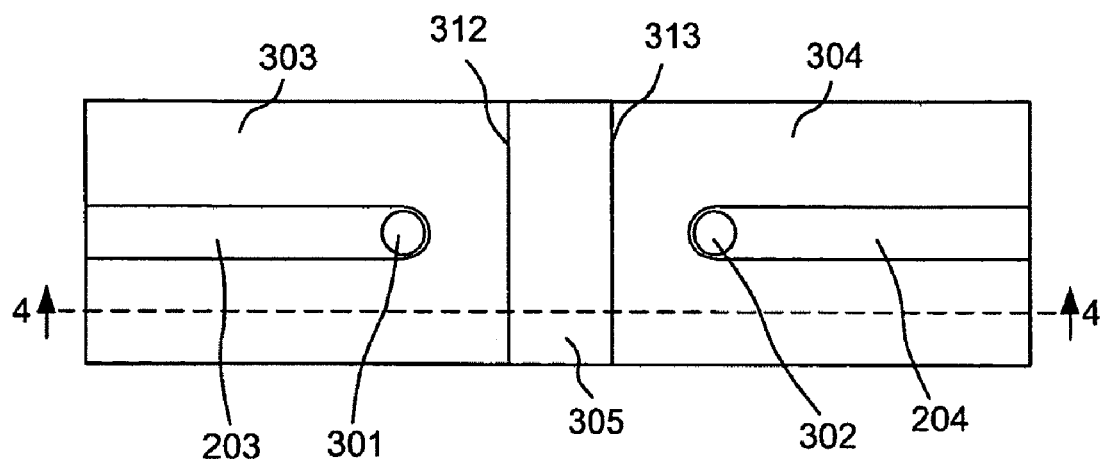
FIG. 3 is a plan view diagram of a portion 202 of the portion of semiconductor wafer 101 in accordance with at least one embodiment.

FIG. 3 is a plan view diagram of a portion 202 of the portion of semiconductor wafer 101 in accordance with at least one embodiment. Portion 202 comprises a die portion 303 of die 103, a die portion 304 of die 104, and a street portion 305 of singulation street 105. Die portion 303 comprises at least a portion of conductive interconnect 203. Conductive interconnect 203 terminates in bonding wire pad 301. Die portion 304 comprises at least a portion of conductive interconnect 204. Conductive interconnect 204 terminates in bonding wire pad 302. Edge 312 defines a boundary between die portion 303 and street portion 305. Edge 313 defines a boundary between die portion 304 and street portion 305.

Figure 4:
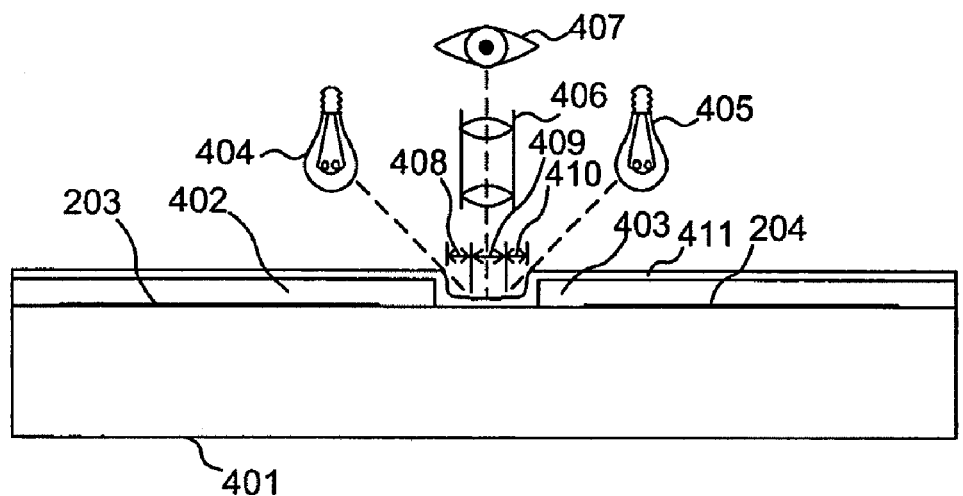
FIG. 4 is a cross-sectional view diagram of the portion 202 of the portion of semiconductor wafer 101 in accordance with at least one embodiment.

FIG. 4 is a cross-sectional view diagram of portion 202 of the portion of semiconductor wafer 101 in accordance with at least one embodiment. Portion 202 comprises substrate 401 and features fabricated over substrate 401. The term "over" (as well as the term "overlies") is used to denote the features being fabricated in layers adjacent to, but not necessarily adjoining, a surface of substrate 401. For example, one or more intervening layers may exist between the surface of substrate 401 and the features, and the features may be implemented in one or more layers. Moreover, the term "over" (as well as the term "overlies") is not intended to denote absolute directionality (e.g., if semiconductor wafer 101 were inverted such that the features were, in an absolute directionality sense, "under" substrate 401, the features would remain "over" substrate 401 as the word "over" is used herein. Conductive interconnects 203 and 204 are fabricated over substrate 401. A thick layer of a first nonmetallic material, including first thick layer portion 402 and second thick layer portion 403, is fabricated over conductive interconnects 203 and 204 and substrate 401. The first nonmetallic material is preferably a brittle material, where "brittle" refers to the material being prone to structural damage (e.g., chipping, cracking, breaking, etc.) during singulation. Such "brittleness" can be exemplified by properties such as the thick layer being quite thick (e.g., greater than 500 nanometers thick (e.g., 1-2 μm thick)), the thick layer being oriented in a packed grain structure, and/or the thick layer exhibiting considerable film stress. The term "nonmetallic" is not intended to preclude the presence of metal atoms in nonmetallic compounds, such as nitrides (e.g., AlN and/or SiN). Rather, such compounds are considered nonmetallic, as they do not exhibit metallic properties.

A gap is defined in the thick layer between first thick layer portion 402 and second thick layer portion 403. A thin layer 411 of a second nonmetallic material is deposited over first thick layer portion 402, second thick layer portion 403, and, optionally, the gap. The thin layer 411 is preferably a passivation layer and is preferably not prone to cracking (e.g., formed as an amorphous layer). Moreover, thin layer 411 is preferably formed from a material that provides a moisture-proof barrier to seal the edges of first thick layer portion 402 and second thick layer portion 403. As the thin layer 411 is substantially thinner than the thick layer, it conformally coats first thick layer portion 402 and second thick layer portion 403, fully encapsulating the edges of the first thick layer portion 402 and the second thick layer portion 403 adjacent to the gap. Accordingly, the exposed surface of thin layer 411 exhibits unevenness, being depressed in at least a portion of the area of the gap.

As the gap may be defined using a process used to define other features (e.g., active circuit features) in the thick layer, it is preferable to use a thick layer that is already used in the fabrication of an integrated circuit and is already being patterned (e.g., etched) for such use. If a pre-existing thick layer is used, street portions of the thick layer can be removed from the streets when removing via portions of the thick layers from vias by adding a mask portion for the streets to mask portions for vias so as to form a mask for removing street portions and via portions of the thick layer simultaneously, thereby avoiding adding additional process steps to the semiconductor fabrication process. Even if a suitably thick layer (e.g., an AlN layer) were not already present, any suitably thick layer could be deposited and selectively removed from the streets then overlapped with any suitable thin impermeable layer (e.g., a SiN layer) to yield a replacement for traditionally metal seal rings. As can be seen in the example illustrated in FIG. 4, by selectively removing a portion of the thick layer and depositing the thin layer, at least a portion of the lower surface of the thick layer is preferably coplanar with at least a portion of the lower surface of the thin layer.

The depression of the thin layer in the at least the portion of the gap, which preferably overlies the singulation street, provides a visible indicator as to the location of the singulation (i.e., dicing) street, which is useful for locating the singulation street during the singulation (i.e., dicing) process. As depicted schematically, the depression may be obliquely illuminated, for example by illumination sources (e.g., light sources) 404 and 405, whereby the angle or angles of illumination cast one or more shadows in the depression, for example over areas denoted by distance 408 and distance 410, while providing greater illumination to other areas, for example over an area denoted by distance 409 located between the shadow areas denoted by distances 408 and 410. The differences in illumination between the shadows and the areas of greater illumination can be observed, for example, via observation instrument (e.g., microscope) 406, as viewed by observer 407. Such observation can be used to determine the proper position of a cutting instrument (e.g., saw) used to singulate (i.e., dice) the dice.

Figure 5:
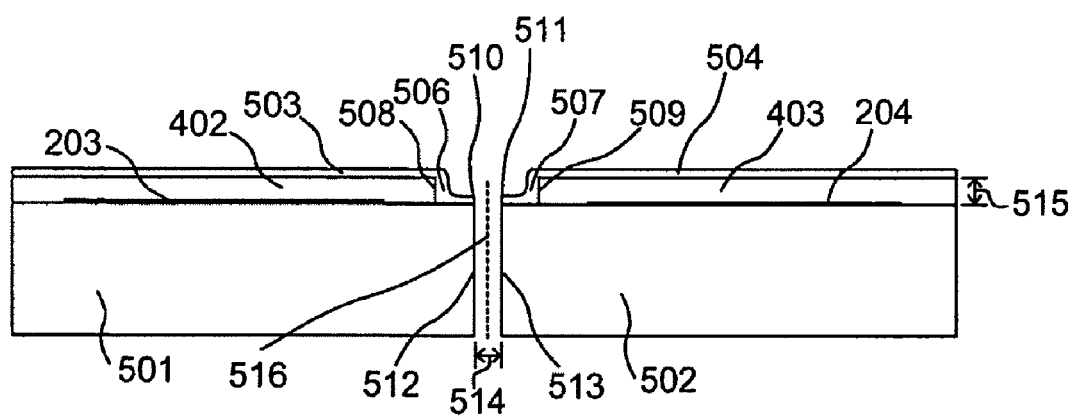
FIG. 5 is a cross-sectional view diagram of the portion 202 of the portion of semiconductor wafer 101 after singulation, in accordance with at least one embodiment.

FIG. 5 is a cross-sectional view diagram of the portion 202 of the portion of semiconductor wafer 101 after singulation in accordance with at least one embodiment. After singulation is performed along a singulation plane 516, substrate portion 501 of substrate 401 is parted from substrate portion 502 of substrate 401, and thin layer portion 503 of thin layer 411 is parted from thin layer portion 503 of thin layer 411. Thin layer portion 503 overlies first thick layer portion 402 and substrate portion 501. Thin layer portion 504 overlies second thick layer portion 403 and substrate portion 502.

Thin layer portion 503 comprises thin layer portion 506, which extends beyond first thick layer portion 402 and fully encapsulates first thick layer portion edge 508 of first thick layer portion 402. Thin layer portion 504 comprises thin layer portion 507, which extends beyond second thick layer portion 403 and fully encapsulates second thick layer portion edge 509 of first thick layer portion 403. First thick layer portion 402 and second thick layer portion 403 are relatively thick, for example with thickness 515 being greater than 500 nanometers (e.g., 1-2 μm).

Singulation defines a kerf 514 along singulation plane 516, a substrate surface 512 of substrate portion 501, a substrate surface 513 of substrate portion 502, a thin layer portion surface 510 of thin layer portion 503, and a thin layer portion surface 511 of thin layer portion 504. Note that while singulation plane 516 is described as a plane and kerf 514, substrate surface 512, substrate surface 513, thin layer portion surface 510, and thin layer portion surface 511 are depicted as having planar attributes, it should be understood that inherent roughness resulting from singulation renders those planar attributes an idealized concept of non-ideal attributes.

By encapsulating first thick layer portion edge 508 and second thick layer portion edge 509, respectively, even after singulation, thin layer portions 506 and 507 provide a moisture-proof barrier to maintain long term reliability and prevent chipping of first thick layer portion 402 and second thick layer portion 403. The discontinuity between the thin layer portion 506 and the first thick layer portion 402, as well as between the thin layer portion 507 and the second thick layer portion 403, help terminate any cracks that might begin in thin layer portions 506 and 507, thereby protecting first thick layer portion 402 and second thick layer portion 403. Moreover, as the thick layer is preferably thicker than stacked metal layers traditionally used for metal seal rings, the first thick layer portion 402 and the second thick layer portion 403 can be even more visibly prominent than traditional metal seal rings, which provides better landmarks within which to guide a singulation tool (e.g., saw). As additional layers are deposited over features defined in previously deposited layers, the height of stacked features is cumulative, so embodiments may be practiced with layers that may be located at any height within a stack of layers over the substrate. Thus, even if a thick layer is located close to the substrate and covered by one or more other layers, benefits may be obtained in accordance with one or more embodiments described herein.

Figure 6:
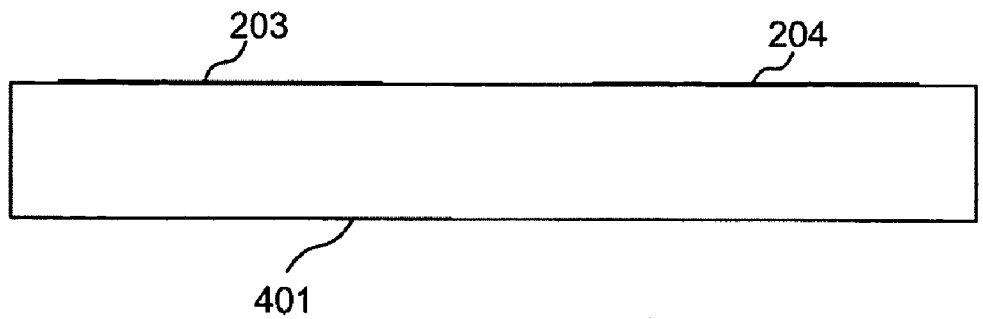
FIG. 6 is a cross-sectional view diagram of the portion 202 of the portion of semiconductor wafer 101 after deposition of any underlying layer(s), but before deposition of the thick layer in accordance with at least one embodiment.

FIG. 6 is a cross-sectional view diagram of the portion 202 of the portion of semiconductor wafer 101 after deposition of any underlying layer(s), but before deposition of the thick layer in accordance with at least one embodiment. Before deposition of the thick layer, portion 202 comprises substrate 401 and conductive interconnects 203 and 204.

Figure 7:
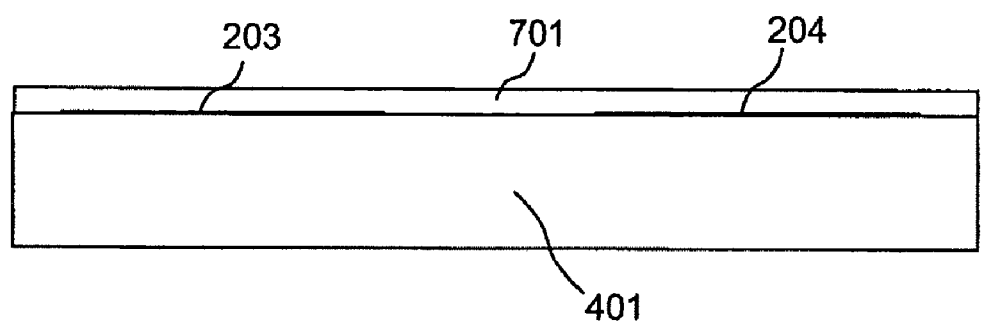
FIG. 7 is a cross-sectional view diagram of the portion 202 of the portion of semiconductor wafer 101 after deposition of the thick layer in accordance with at least one embodiment.

FIG. 7 is a cross-sectional view diagram of the portion 202 of the portion of semiconductor wafer 101 after deposition of the thick layer in accordance with at least one embodiment. After deposition of the thick layer, portion 202 comprises substrate 401, conductive interconnects 203 and 204, and thick layer 701. Note that thick layer 701 need not be selectively deposited, but may be deposited over an entire surface overlying substrate 401.

Figure 8:
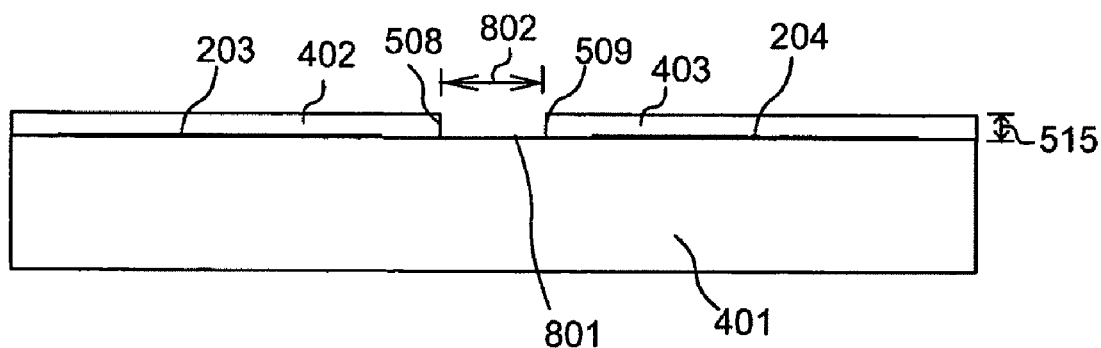
FIG. 8 is a cross-sectional view of the portion 202 of the portion of semiconductor wafer 101 after selective removal of at least one portion of the thick layer in accordance with at least one embodiment.

FIG. 8 is a cross-sectional view of the portion 202 of the portion of semiconductor wafer 101 after selective removal of at least one portion of the thick layer in accordance with at least one embodiment. After selective removal of at least one portion of the thick layer (e.g., etching), a gap 802 is defined between first thick layer portion 402 and second thick layer portion 403, exposing a surface 801 previously underlying the removed portion of thick layer 701.

Figure 9:
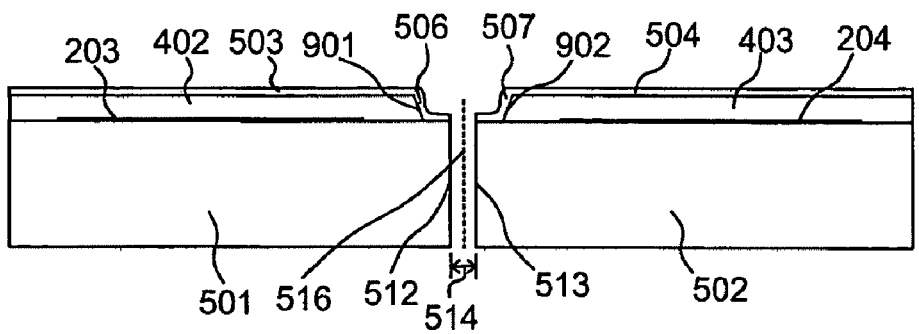
FIG. 9 is a cross-sectional view of a portion of a portion of semiconductor wafer 101 where thick edges 901 and 902 have an angled profile in accordance with at least one embodiment.

FIG. 9 is a cross-sectional view of a portion of a portion of semiconductor wafer 101 where thick edges 901 and 902 have an angled profile in accordance with at least one embodiment. While, as depicted in FIGS. 5 and 8, gap 802 may be defined such that first thick layer portion edge 508 and second thick layer portion edge 509 have profiles substantially parallel to singulation plane 516, alternatively gap 802 may be defined such that first thick layer portion edge 901 and second thick layer portion edge 902 are not substantially parallel to singulation plane 516. For example, first thick layer portion edge 901 and second thick layer portion edge 902 are depicted as being inclined relative to singulation plane 516. Such a tapered or beveled edge can be advantageous for controlling deposition of thin layer portion 503 such that thin layer portion 506 encapsulates thick layer portion edge 901 and of thin layer portion 504 such that thin layer portion 507 encapsulates thick layer portion edge 902.

Figure 10:
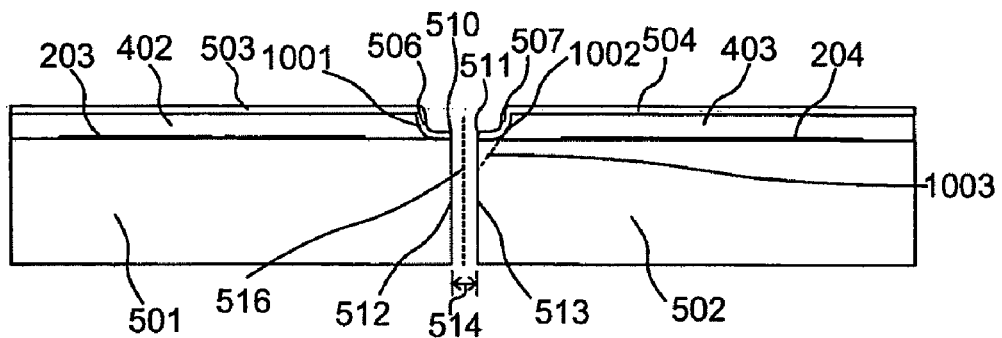
FIG. 10 is a cross-sectional view of a portion of a portion of semiconductor wafer 101 where thick edges 1001 and 1002 have a curved profile in accordance with at least one embodiment.

FIG. 10 is a cross-sectional view of a portion of a portion of semiconductor wafer 101 where thick edges 1001 and 1002 have a curved profile in accordance with at least one embodiment. Some selective removal processes (e.g., isotropic etching processes) tend to leave features having edges with curved profiles, such as thick edge 1001 and 1002. Such curved profiles may have a continuous single radius of curvature or a varying radius of curvature, including radii of curvature on the same and/or opposite sides of the curved profiles. Any number of lines may be tangential to such curved profiles. An example of a line tangential to curved profile 1002 is tangent 1003, which intersects singulation plane 516, as well as a kerf edge comprising substrate surface 513 and thin layer portion surface 511, at an angle. Accordingly, it may be said that the thick layer defines a thick edge of a thick layer to have a profile wherein at least a portion of the profile is tangentially inclined relative to a plane of the first kerf edge and/or the singulation plane 516. As the linear first and second thick layer portion edges 901 and 902 of FIG. 9 may be considered curved profiles having an infinite radius of curvature, it may also be said that the linear first and second thick layer portion edges 901 and 902 have profiles wherein at least a portion of the profile is tangentially inclined relative to a plane of the first kerf edge and/or the singulation plane 516. Accordingly, the curved profiles depicted in FIG. 10 may be considered to be a special case of curved profiles with finite radii of curvature.

Figure 11:
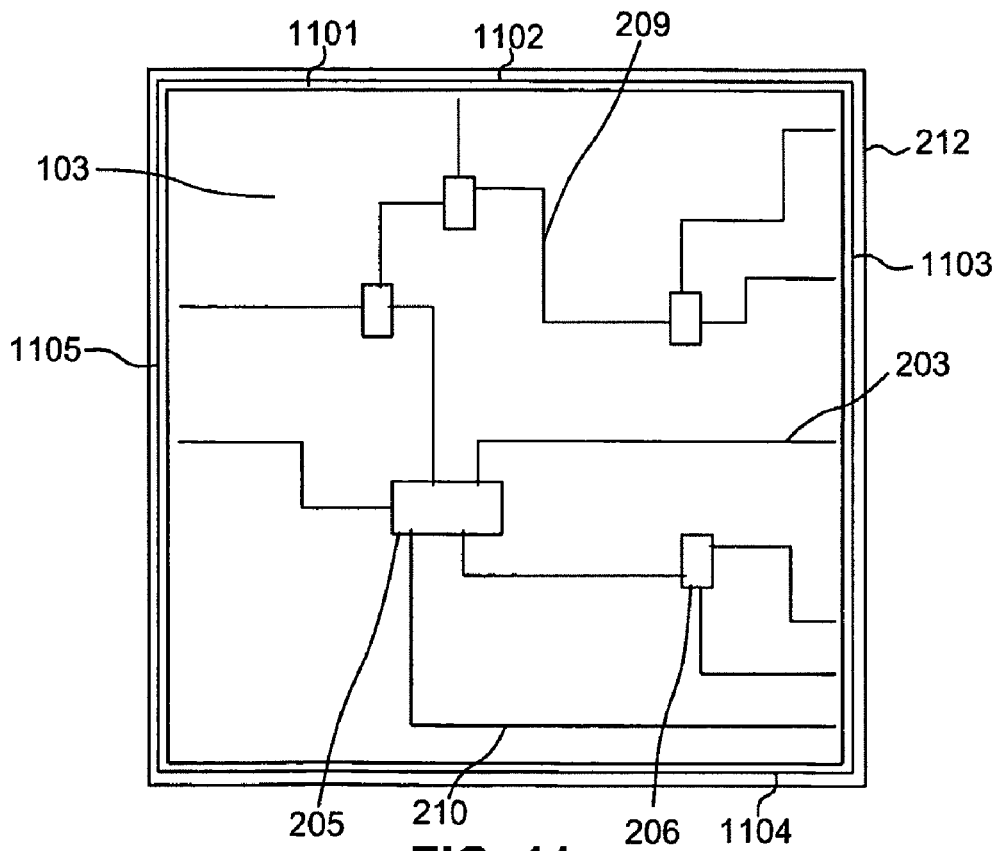
FIG. 11 is a plan view of semiconductor die 103 having a portion of a thick layer surrounding circuitry of semiconductor die 103 in accordance with at least one embodiment.

FIG. 11 is a plan view of semiconductor die 103 having a portion of a thick layer surrounding circuitry of semiconductor die 103 in accordance with at least one embodiment. As noted with respect to FIG. 1, die 103 comprises active circuit elements such as exemplary active circuit elements 205 and 206 and conductive interconnects (e.g., vias) such as exemplary conductive interconnects 203, 209, and 210, as well as edge 213. At least one portion 1101 of the thick layer of the first nonmetallic layer surrounds circuitry (e.g., these active circuit elements) of die 103. For example, if die 103 is rectangular, the at least one portion 101 may comprise a first portion 1102 near a first edge of die 103, a second portion 1103 near a second edge of die 103, a third portion 1104 near a third edge of die 103, and a fourth edge 1105 near a fourth edge of die 103, wherein the first, second, third, and fourth portions 1102, 1103, 1104, and 1105 preferably adjoin each other to form a contiguous portion of the thick layer completely surrounding the circuitry of die 103.

Figure 12:
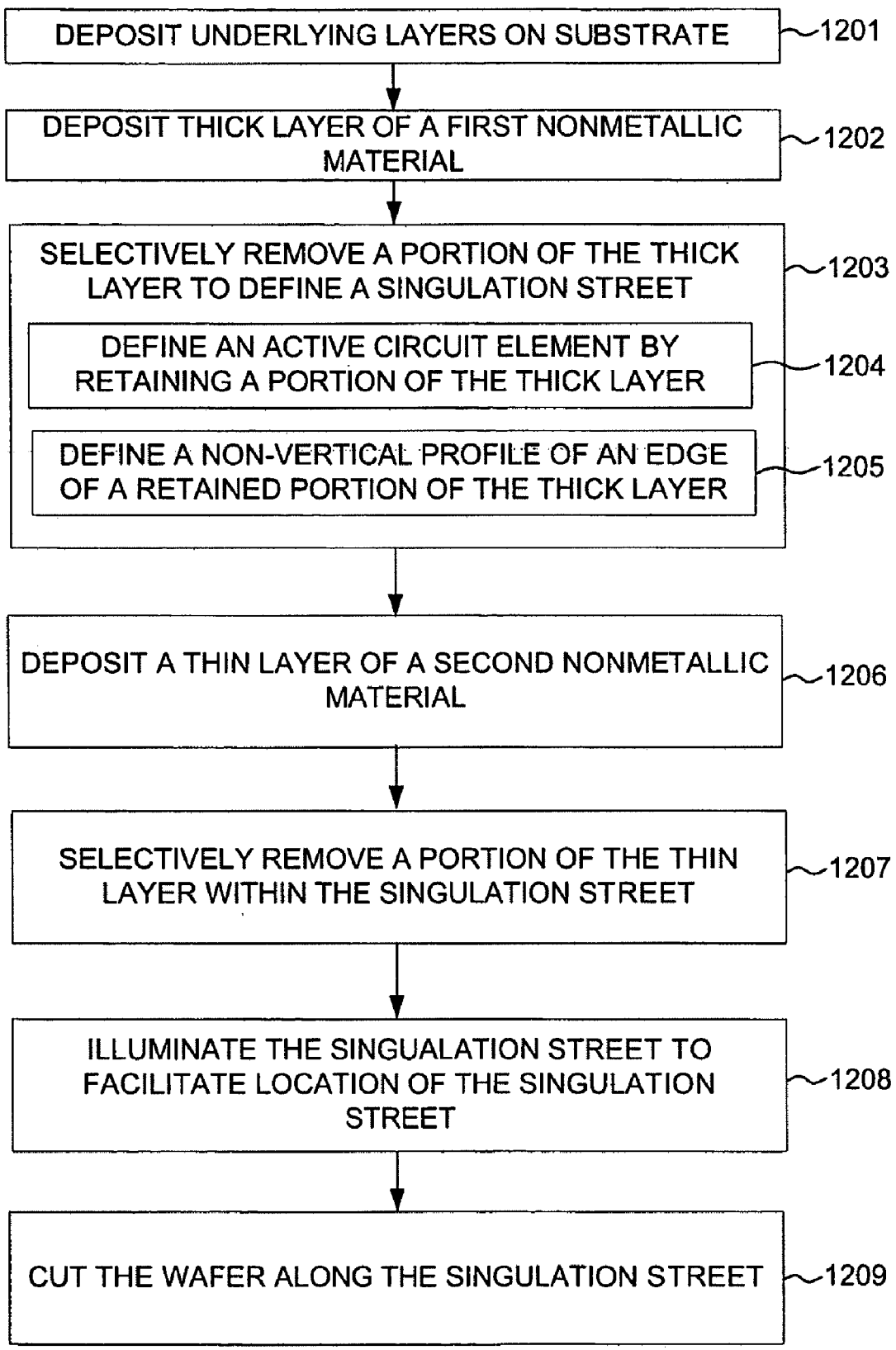
FIG. 12 is a flow diagram of a method in accordance with at least one embodiment.

FIG. 12 is a flow diagram of a method in accordance with at least one embodiment. The method comprises at least one of steps 1201, 1202, 1203, 1204, 1205, 1206, 1207, 1208, and 1209. In step 1201, at least one underlying layer is deposited on a substrate. Such layers may be patterned, for example by etching, so as to leave at least a portion of the at least one underlying layer and to remove at least another portion of the at least one underlying layer. From step 1201, the method continues at step 1202. In step 1202, a thick layer of a first nonmetallic material is deposited over a semiconductor wafer. From step 1202, the method continues at step 1203. In step 1203, at least a second portion of the thick layer is selectively removed to define a singulation street between a first die of the wafer and a second die of the wafer while leaving at least a first portion of the thick layer over the first die.

Step 1203 may comprise step 1204 and/or step 1205. In step 1204, at least one active circuit element is defined by retaining at least a portion of the thick layer. For example, in a bulk acoustic wave (BAW) device, at least a portion of a thick layer of AlN may be retained to function as an active circuit element of the BAW device. In step 1205, a non-vertical profile (i.e., a profile wherein at least a portion of the profile is tangentially inclined relative to a plane of the first kerf edge and/or a singulation plane) is defined on an edge of a retained portion of the thick layer. From step 1203, the method continues to step 1206.

In step 1206, a thin layer of a second nonmetallic material is deposited over a die, including over at least one retained portion of the thick layer. From step 1206, the method continues to step 1207. In step 1207, a portion of the thin layer is selectively removed within at least a portion of the singulation street. Even if the thin layer is not brittle, removal of at least a portion of the thin layer from at least a portion of the singulation street can help provide better visual definition of the singulation street during the singulation process. If the thin layer is brittle, removal of at least a portion of the thin layer from at least a portion of the singulation street can help reduce cracking and help provide better visual definition of the singulation street. From step 1207, the method continues to step 1208. In step 1208, the singulation street is illuminated to facilitate location of the singulation street. From step 1208, the method continues to step 1209. In step 1209, the wafer is cut along the singulation street to separate the first die from the second die. The cutting is preferably performed along the singulation street so as to retain a first portion of the thin layer between the first portion of the thick layer and a kerf defined by the cutting the wafer, wherein the first portion of the thin layer encapsulates the first portion of the thick layer.

It should be noted that one or more steps of FIG. 12 may be omitted. For example, if step 1207 is omitted, the method could continue from step 1206 to step 1208. The first nonmetallic material preferably comprises a brittle material, and the second nonmetallic material preferably comprises an amorphous moisture-barrier material. The first nonmetallic material preferably comprises an aluminum nitride, and the second nonmetallic material preferably comprises silicon nitride. The first portion of the thick layer preferably extends contiguously near a perimeter of the first die, thereby surrounding circuitry of the first die. The thick layer has a thickness of preferably at least 500 nanometers.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, an improved semiconductor seal ring and method therefor has been described.

What is claimed is:

1. A method comprising:

depositing a thick layer of a first nonmetallic material over a semiconductor wafer, the first nonmetallic material comprising a brittle material;

depositing a thin layer of a second nonmetallic material over the thick layer, the second nonmetallic layer comprising an amorphous moisture-barrier material;

selectively removing a second portion of the thick layer to define a singulation street between a first die of the wafer and a second die of the wafer while leaving a first portion of the thick layer over the first die; and cutting the wafer along the singulation street to separate the first die from the second die, wherein the cutting the wafer along the singulation street includes retaining a first portion of the thin layer between the first portion of the thick layer and a kerf defined by the cutting the wafer, wherein the first portion of the thin layer encapsulates the first portion of the thick layer.

2. The method of claim 1, wherein depositing the thin layer of the second non-metallic material includes depositing the thin layer in contact with the thick layer.

3. The method of claim 1, wherein the brittle material comprises aluminum nitride; and
wherein the amorphous moisture-barrier material comprises silicon nitride.

4. The method of claim 1, further comprising:
forming circuitry on the first die; and
wherein depositing the thick layer includes depositing the thick layer with the first portion of the thick layer extending contiguously near a perimeter of the first die and surrounding the circuitry of the first die.

5. The method of claim 1, wherein depositing the thick layer includes depositing the thick layer with a thickness of at least 500 nanometers.

6. The method of claim 1, wherein selectively removing the second portion of the thick layer includes etching the thick layer to define tapered edges of the singulation street.

* * * * *